(12) United States Patent
Xue

(10) Patent No.: US 12,482,760 B2
(45) Date of Patent: Nov. 25, 2025

(54) SEMICONDUCTOR STRUCTURE AND MANUFACTURING METHOD THEREOF

(71) Applicants: CHANGXIN MEMORY TECHNOLOGIES, INC., Hefei (CN); CHANGXIN JIDIAN (BEIJING) MEMORY TECHNOLOGIES CO., LTD., Beijing (CN)

(72) Inventor: Dong Xue, Hefei (CN)

(73) Assignees: CHANGXIN MEMORY TECHNOLOGIES, INC., Hefei (CN); CHANGXIN JIDIAN (BEIJING) MEMORY TECHNOLOGY CO., LTD., Beijing (CN)

( * ) Notice: Subject to any disclaimer, the term of this patent is extended or adjusted under 35 U.S.C. 154(b) by 755 days.

(21) Appl. No.: 17/806,361

(22) Filed: Jun. 10, 2022

(65) Prior Publication Data
US 2023/0352420 A1   Nov. 2, 2023

(30) Foreign Application Priority Data

Apr. 29, 2022   (CN) .......................... 202210462528.5

(51) Int. Cl.
H01L 23/544   (2006.01)

(52) U.S. Cl.
CPC .. *H01L 23/544* (2013.01); *H01L 2223/54426* (2013.01); *H01L 2223/54453* (2013.01)

(58) Field of Classification Search
CPC ......... H01L 23/544; H01L 2223/54426; H01L 2223/54453
See application file for complete search history.

(56) References Cited

U.S. PATENT DOCUMENTS

| 6,713,884 B2 * | 3/2004 | Weis ................... H10D 84/038 |
| | | 257/E23.179 |
| 9,633,917 B2 | 4/2017 | Tsai et al. |
| 2004/0023138 A1 | 2/2004 | Stacker et al. |

FOREIGN PATENT DOCUMENTS

| CN | 102938364 A | 2/2013 |
| CN | 106469717 B | 4/2019 |
| JP | 2002280295 A | 9/2002 |

OTHER PUBLICATIONS

First Office Action cited in CN202210462528.5 mailed Jun. 23, 2022, 17 pages.
Second Office Action cited in CN202210462528.5 mailed Aug. 5, 2022, 11 pages.

* cited by examiner

*Primary Examiner* — Britt D Hanley
*Assistant Examiner* — Victor V Barzykin
(74) *Attorney, Agent, or Firm* — Kilpatrick Townsend & Stockton LLP

(57) ABSTRACT

The present disclosure provides a semiconductor structure and a manufacturing method thereof, and relates to the technical field of semiconductors. The semiconductor structure includes an interconnecting line layer, wherein the interconnecting line layer includes a first region and a second region, and the first region includes a first alignment mark thereon; an isolation structure disposed in the second region of the interconnecting line layer; and a redistribution layer conformally covering the first region of the interconnecting line layer and the isolation structure, wherein the redistribution layer includes a second alignment mark, and the second alignment mark is located above the first alignment mark.

13 Claims, 7 Drawing Sheets

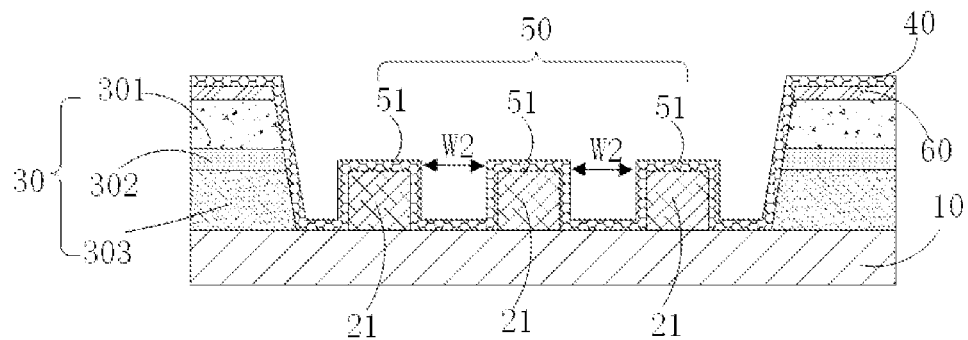

FIG. 1

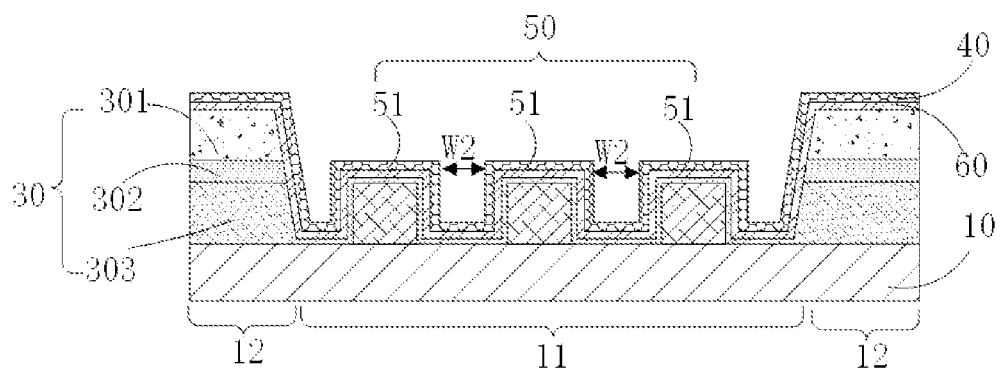

FIG. 2

| Provide a first structure, wherein the first structure includes an interconnecting line layer and an isolation structure, the interconnecting line layer includes a first region and a second region, a first alignment mark is formed in the first region of the interconnecting line layer, and the isolation structure is formed in the second region of the interconnecting line layer | S110 |

| Form a redistribution layer, wherein the redistribution layer conformally covers the first region of the interconnecting line layer and the isolation structure, and a part of the redistribution layer above the first alignment mark forms a second alignment mark | S120 |

FIG. 3

SEMICONDUCTOR STRUCTURE AND MANUFACTURING METHOD THEREOF

CROSS-REFERENCE TO RELATED APPLICATION

This application claims the priority of Chinese Patent Application No. 202210462528.5, submitted to the Chinese Intellectual Property Office on Apr. 29, 2022, the disclosure of which is incorporated herein in its entirety by reference.

TECHNICAL FIELD

The present disclosure relates to the technical field of semiconductors, and in particular to a semiconductor structure and a manufacturing method thereof.

BACKGROUND

As the semiconductor packaging develops to be more miniaturized, high-integrated and versatile, increasingly high requirements are imposed on the reliability of the semiconductor packaging. To ensure the packaging effect and reduce the wiring complexity in the back-end-of-line, an alignment mark is usually formed on the semiconductor structure in the front-end-of-line, and is detected by using a probe to improve reliability of the packaging process.

However, in the back-end-of-line, a plurality of material layers may cover the semiconductor structure from the front-end-of-line, and the morphology of the alignment mark on the semiconductor structure from the front-end-of-line needs to be transferred multiple times, resulting in an extreme change in the morphology of the alignment mark, thus affecting the accuracy of the probe detection.

SUMMARY

An overview of the subject described in detail in the present disclosure is provided below. The overview is not intended to limit the protection scope of the claims.

The present disclosure provides a semiconductor structure and a manufacturing method thereof.

A first aspect of the present disclosure provides a semiconductor structure. The semiconductor structure includes:
  an interconnecting line layer, wherein the interconnecting line layer includes a first region and a second region, and the first region of the interconnecting line layer includes a first alignment mark;
  an isolation structure, wherein the isolation structure is disposed in the second region of the interconnecting line layer; and
  a redistribution layer, wherein the redistribution layer conformally covers the first region of the interconnecting line layer and the isolation structure, the redistribution layer includes a second alignment mark, and the second alignment mark is located above the first alignment mark.

A second aspect of the present disclosure provides a method of manufacturing a semiconductor structure, including:
  providing a first structure, wherein the first structure includes an interconnecting line layer and an isolation structure, the interconnecting line layer includes a first region and a second region, a first alignment mark is formed in the first region of the interconnecting line layer, and the isolation structure is formed in the second region of the interconnecting line layer; and forming a redistribution layer, wherein the redistribution layer conformally covers the first region of the interconnecting line layer and the isolation structure, and a part of the redistribution layer above the first alignment mark forms a second alignment mark.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

FIG. 1 is a schematic diagram of a semiconductor structure according to an exemplary embodiment;

FIG. 2 is a schematic diagram of a semiconductor structure according to an exemplary embodiment;

FIG. 3 is a flowchart of a method of manufacturing a semiconductor structure according to an exemplary embodiment;

DETAILED DESCRIPTION

Figure 4:
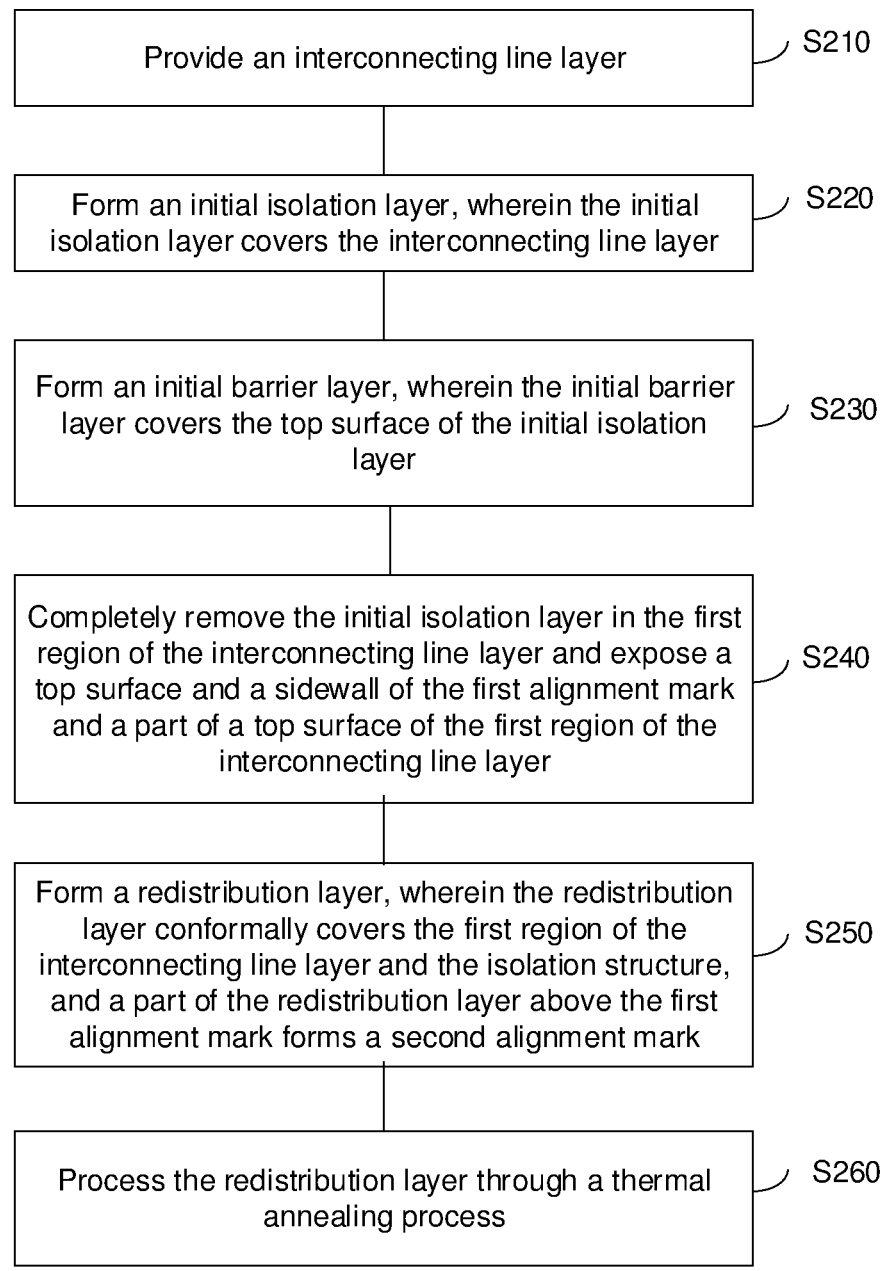
FIG. 4 is a flowchart of a method of manufacturing a semiconductor structure according to an exemplary embodiment.

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Embodiments of the present disclosure provide a semiconductor structure and a method of manufacturing a semiconductor structure. The semiconductor structure includes an interconnecting line layer, where the interconnecting line layer includes a first region and a second region, and the first region includes a first alignment mark thereon; an isolation structure disposed in the second region of the interconnecting line layer; and a redistribution layer conformally covering the first region of the interconnecting line layer and the isolation structure, where the redistribution layer includes a second alignment mark, and the second alignment mark is located above the first alignment mark. A part of the redistribution layer covers an outer surface of the first alignment mark to form the second alignment mark. A morphology of the first alignment mark is transferred to the second alignment mark. The deviation of the second alignment mark relative to the first alignment mark is small. The position of the second alignment mark is identified by using a probe on the outer surface of the redistribution layer, thereby measuring and localizing the first alignment mark more accurately, which facilitates the measurement and positioning for packaging the semiconductor structure, thereby improving the positioning precision of the semiconductor structure.

According to an exemplary embodiment, this embodiment provides a semiconductor structure, as shown in FIG. 1 to FIG. 7, the semiconductor structure in this embodiment includes an interconnecting line layer 10. The interconnecting line layer 10 includes a first region 11 and a second region 12. The first region 11 of the interconnecting line layer 10 includes a first alignment mark 20. The semiconductor structure further includes an isolation structure 30 and a redistribution layer 40. The isolation structure 30 is disposed in the second region 12 of the interconnecting line layer 10. The redistribution layer 40 conformally covers the first region 11 of the interconnecting line layer 10 and the isolation structure 30. The redistribution layer 40 includes a second alignment mark 50. The second alignment mark 50 is located above the first alignment mark 20.

In this embodiment, the interconnecting line layer 10 is disposed on a substrate. The substrate may be a semiconductor substrate, and a material of the semiconductor substrate may include one or more selected from the group consisting of silicon (Si), germanium (Ge), silicon germanium (GeSi), and silicon carbide (SiC), or another material, for example, an III-V compound such as gallium arsenide. A material of the first alignment mark 20 may include at least one selected from the group consisting of copper, aluminium, and chromium. The redistribution layer 40 is made of a metal material, which may include at least one selected from the group consisting of copper, aluminium, chromium, cadmium, nickel, and argentum.

In some possible embodiments, the interconnecting line layer 10 includes a first region 11 and a second region 12. The second region 12 of the interconnecting line layer 10 is another region rather than the first region 11. The first region 11 is adjacent to the second region 12. The first region 11 and the second region 12 form the entire interconnecting line layer 10. The isolation structure 30 covers the second region 12 of the interconnecting line layer 10.

The isolation structure 30 may be of a single-layer structure or a multi-layer structure. The material of the isolation structure 30 may include at least one selected from the group consisting of silicon oxide, silicon nitride, and silicon oxynitride. As shown in FIG. 1 to FIG. 7, in this embodiment, the isolation structure 30 includes a first isolation layer 301, a second isolation layer 302, and a third isolation layer 303 that sequentially cover the interconnecting line layer 10. The material of the first isolation layer 301 includes silicon oxide, the material of the second isolation layer 302 includes silicon nitride, and the material of the third isolation layer 303 includes silicon oxide.

Certainly, it can be understood that the interconnecting line layer 10 may include another region besides the first region 11 and the second region 12. In some possible embodiments, with reference to FIG. 6 and FIG. 7, the interconnecting line layer 10 includes a functional region 13. The functional region 13 is located in the second region 12. The functional region 13 forms a partial structure of the second region 12. Moreover, the first region 11 and the functional region 13 of the interconnecting line layer 10 are electrically isolated. A functional device is formed in the functional region 13. For example, a memory array may be formed in the functional region 13. The first region 11 and the functional region 13 are electrically isolated, which can avoid electrical conduction between the device in the first region 11 and the functional device in the functional region 13, and prevent the device in the first region 11 from interfering with the functional device in the functional region 13.

As shown in FIG. 1 to FIG. 7, the first alignment mark 20 is disposed on the first region 11 of the interconnecting line layer 10. The devices in the first alignment mark 20 and the functional region 13 are electrically isolated. The top surface of the isolation structure 30 is higher than the top surface of the first alignment mark 20. The redistribution layer 40 continuously covers a top surface and a sidewall of the isolation structure 30 and an outer surface of the first alignment mark 20.

The redistribution layer 40 conformally covers the first alignment mark 20 and the isolation structure 30. The redistribution layer 40 covering the outer surface of the first alignment mark 20 forms the second alignment mark 50, that is, the partial structure of the redistribution layer 40 forms the second alignment mark 50. The second alignment mark 50 covers the outer surface of the first alignment mark. The morphologies of the second alignment mark 50 and the first alignment mark 20 are similar in appearance. "Similar in appearance" in this embodiment is similar to "similar" in mathematics. For example, the morphology of the second alignment mark 50 is similar to that of the first alignment mark 20. Although the sizes of the second alignment mark 50 and the first alignment mark 20 are different, the shapes of the second alignment mark 50 and the first alignment mark 20 are same.

In some possible embodiments, as shown in FIG. 1 to FIG. 7, the first alignment mark 20 includes a plurality of first sub-marks 21. The plurality of first sub-marks 21 are disposed independently of each other, and spacings between any two adjacent first sub-marks 21 may be same or different. Certainly, it can be understood that the quantity of the first sub-marks 21 is set according to a specific requirement. The first alignment mark 20 may also include only one first sub-mark 21. The second alignment mark 50 includes a plurality of second sub-marks 51. The plurality of second sub-marks 51 and the plurality of first sub-marks 21 are disposed in a one-to-one correspondence, and each second sub-mark 51 covers the first sub-mark 21 corresponding thereto. It can be understood that there is also one second sub-mark 51 when there is one first sub-mark 21.

In some embodiments, as shown in FIG. 1 to FIG. 7, the spacing between two adjacent first sub-marks 21 is a first spacing W1, the spacing between two adjacent second sub-marks 51 is a second spacing W2, and the second spacing W2 is 80% to 98% of the first spacing W1. The morphology of each first sub-mark 21 is transferred to the second sub-mark 51 located above it. In this embodiment, the thickness of the redistribution layer 40 is controlled, such that the second spacing W2 is 80% to 98% of the first spacing W1, which avoids that the second alignment mark 50 is difficult to detect by using a probe because the redistribution layer 40 is extremely thick to fill up a trench between two adjacent first sub-marks 21. For example, the second spacing W2 may be 80%, 82%, 84%, 85%, 87%, 89%, 90%, 92%, 94%, 95%, 97%, or 98% of the first spacing W1.

In some embodiments, if the projection formed by the first sub-mark 21 on the interconnecting line layer 10 is a triangle, a quadrangle, or a right-angled zigzag line, the projection of the second sub-mark 51 on the interconnecting line layer 10 is a triangle, a quadrangle, or a right-angled zigzag line similar to the projection of the first sub-mark 21. The first sub-mark 21 and the second sub-mark 51 have a same aspect ratio. In this embodiment, the semiconductor structure is described by using an example in which when the projection formed by the first sub-mark 21 on the interconnecting line layer 10 is a square, the projection of the second sub-mark 51 covering the first sub-mark 21 on the interconnecting line layer 10 is also a square.

The morphologies of the second sub-mark 51 and the first sub-mark 21 are highly similar. When the probe scratches the outer surface of the redistribution layer 40, the position of the second sub-mark 51 can be located through the change of the height difference, to measure and localize the position of the first sub-mark 21, improving the precision of the probe detection.

In some embodiments, the first sub-mark 21 may further include a notch or a protrusion. Correspondingly, the second sub-mark 51 has a notch or a protrusion similar to the notch or the protrusion of the first sub-mark 21. In the subsequent process, when the probe scratches the outer surface of the redistribution layer 40, a comparison with another region is made by using the notch or protrusion of the second sub-mark 51, to identify the position of the second sub-mark 51 and locate the position of the first sub-mark 21 according to the second sub-mark 51. The notch or protrusion can make probe detection more accurate and reduce the probability of the detection failure.

In the semiconductor structure of this embodiment, a part of the structure of the redistribution layer 40 covers the first alignment mark 20 to form the second alignment mark 50, such that the morphology of the first alignment mark 20 is transferred to the second alignment mark 50, ensuring that the morphologies of the second alignment mark 50 and the first alignment mark 20 are highly similar. Therefore, in the subsequent process, the position and morphology of the first sub-mark 21 can be located according to the morphology of the second alignment mark 50 by scratching the outer surface of the redistribution layer 40 with the probe, which improves the detection accuracy of locating the semiconductor structure by using the probe, while reducing the detection difficulty.

In some embodiments, as shown in FIG. 2 to FIG. 14, the semiconductor structure further includes a dielectric layer 90. The material of the dielectric layer 90 may include at least one selected from the group consisting of silicon oxide, silicon nitride, and silicon oxynitride. The dielectric layer 90 is disposed in the first region 11 of the interconnecting line layer 10, and the dielectric layer 90 is located between the interconnecting line layer 10 and the redistribution layer 40. The thickness of the dielectric layer 90 is smaller than a preset threshold. The dielectric layer 90 may be integrated with the isolation structure 30. Certainly, it can be understood that the dielectric layer 90 and the isolation structure 30 may be further disposed separately.

In an example, the dielectric layer 90 is disposed between the first alignment mark 20 and the second alignment mark 50. The preset threshold is one tenth of the height of the first alignment mark 20, that is, the thickness of the dielectric layer 90 is smaller than one tenth of the height of the first alignment mark 20, avoiding that the dielectric layer 90 is extremely thick to cause the deformation of the morphology transferred from the first alignment mark 20 through the dielectric layer 90, and ensuring that the morphology of the first alignment mark 20 can be well transferred to the second alignment mark 50, such that the detection result of locating the first alignment mark 20 through the subsequent probe detection on the outer surface of the redistribution layer 40 is more accurate.

In some embodiments, as shown in FIG. 1 to FIG. 15, the semiconductor structure further includes a barrier layer 60. The material of the barrier layer 60 includes tantalum or a compound of tantalum, or titanium or a compound of titanium. The barrier layer 60 covers at least the top of the isolation structure 30 in the second region 12 of the interconnecting line layer 10. In an example, as shown in FIG. 2, the barrier layer 60 may conformally cover the first region 11 of the interconnecting line layer 10 and the isolation structure 30, and the barrier layer 60 is located below the redistribution layer 40, to prevent the material in the redistribution layer 40 from diffusing into the interconnecting line layer 10 and prevent the interconnecting line layer 10 from being polluted.

In an example, as shown in FIG. 1 to FIG. 6, the functional region 13 is located in the second region 12, and an electrical isolation structure (not shown in the figure) is also disposed in the second region 12, and used to electrically isolate the first region 11 from functional region 13. Therefore, in this example, to prevent the material in the redistribution layer 40 from diffusing into the functional region 13, the barrier layer 60 may be disposed only on the top surface of the second region 12, that is, the barrier layer 60 may only cover the top surface of the isolation structure 30, avoiding the contamination of the device in the functional region 13.

As shown in FIG. 3, an exemplary embodiment of the present disclosure provides a method of manufacturing a semiconductor structure. The manufacturing method includes the following steps:

Step S110: Provide a first structure, wherein the first structure includes an interconnecting line layer and an isolation structure, the interconnecting line layer includes a first region and a second region, a first alignment mark is formed in the first region of the interconnecting line layer, and the isolation structure is formed in the second region of the interconnecting line layer.

As shown in FIG. 1 to FIG. 14, the first structure 70 in this embodiment is a semiconductor structure in the back-end-of-line. The interconnecting line layer 10 is disposed on a substrate. The substrate may be a semiconductor substrate, and a material of the semiconductor substrate may include one or more selected from the group consisting of Si, Ge, GeSi, and SiC, or another material, for example, an III-V compound such as gallium arsenide.

With reference to FIG. 2 to FIG. 7, the interconnecting line layer 10 includes a first region 11 and a second region 12. The second region 12 of the interconnecting line layer 10 is another region rather than the first region 11. The first region 11 is adjacent to the second region 12. The first region 11 and the second region 12 form the entire interconnecting line layer. The isolation structure 30 covers the second region 12 of the interconnecting line layer 10. The top surface of the isolation structure 30 is higher than the top surface of the first alignment mark 20. The material of the isolation structure 30 may include at least one selected from the group consisting of silicon oxide, silicon nitride, and silicon oxynitride. A material of the first alignment mark 20 may include at least one selected from the group consisting of copper, aluminium, and chromium.

Figure 6:
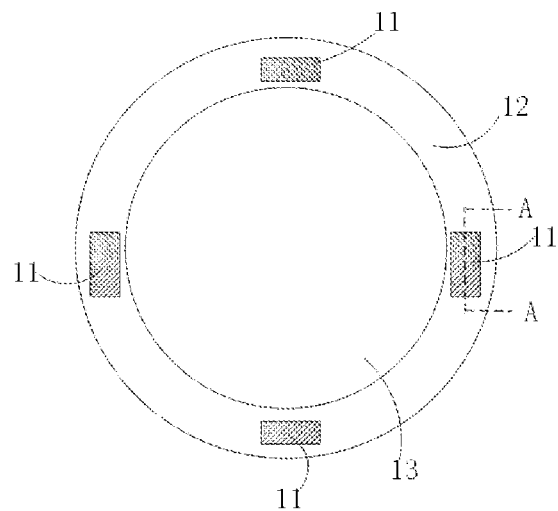
FIG. 6 is a top view of an interconnecting line layer according to an exemplary embodiment.
Figure 7:
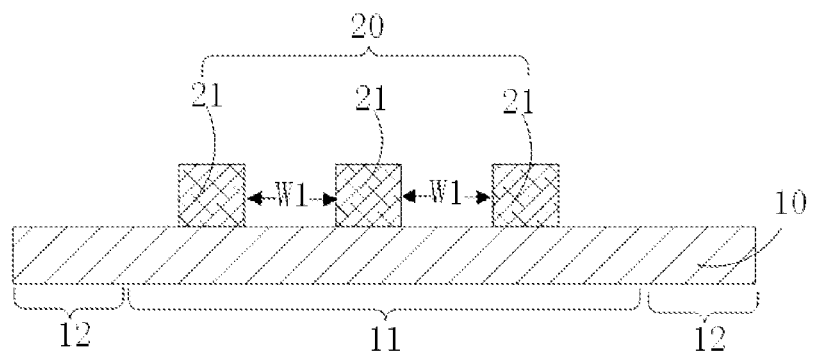
FIG. 7 is a schematic diagram of a cross section taken along A-A in FIG. 6.
Figure 8:
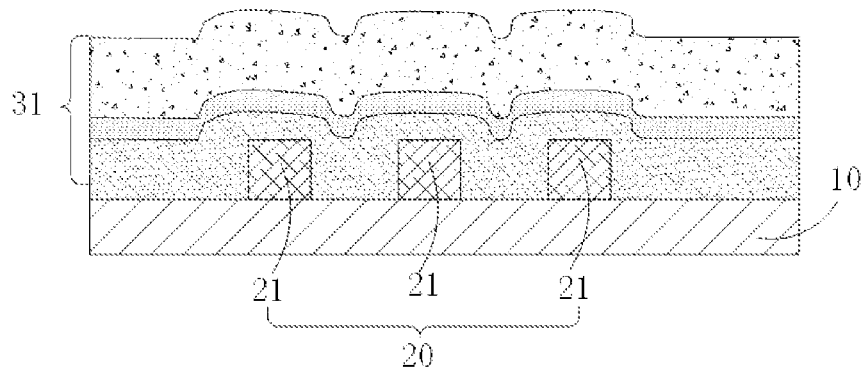
FIG. 8 is a schematic diagram of a cross section taken along A-A of forming an initial isolation layer according to an exemplary embodiment.
Figure 9:
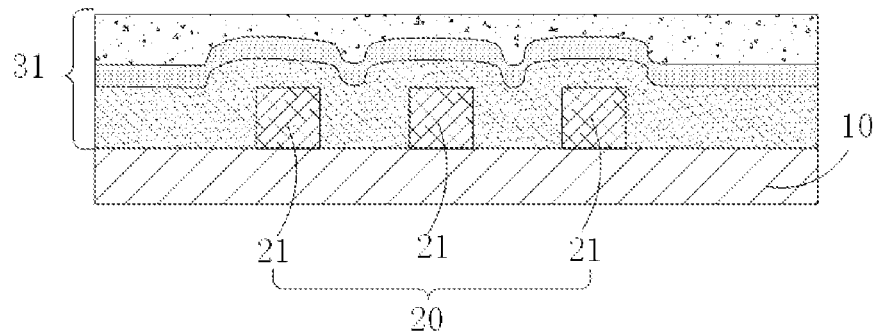
FIG. 9 is a schematic diagram of a cross section taken along A-A of polishing a top surface of the initial isolation layer according to an exemplary embodiment.
Figure 10:
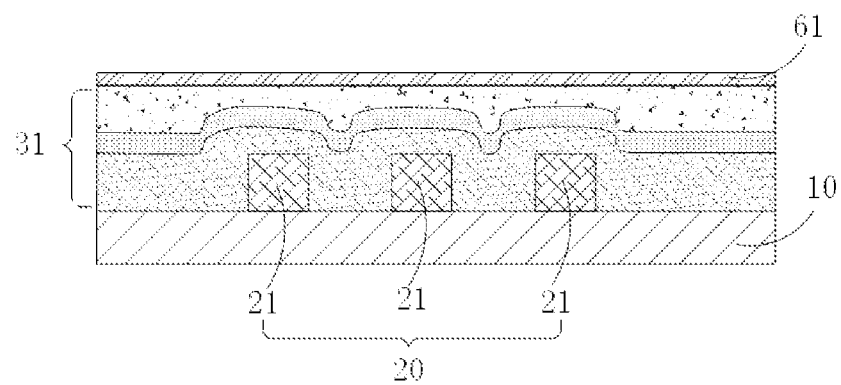
FIG. 10 is a schematic diagram of a cross section taken along A-A of forming an initial barrier layer according to an exemplary embodiment.

In some possible embodiments, with reference to FIG. 6 and FIG. 7, the interconnecting line layer 10 of the first structure 70 includes a functional region 13. The functional region 13 is located in the second region 12. Moreover, the first region 11 and the functional region 13 of the interconnecting line layer 10 are electrically isolated. The first alignment mark 20 is disposed in the first region 11 of the interconnecting line layer 10, and the first region 11 and the functional region 13 are electrically isolated. Therefore, the first alignment mark 20 is electrically isolated from the device in the functional region 13, to prevent the electrical conduction between the device in the first region 11 and the functional device in the functional region 13 from interfering with the functional region 13.

Step S120: Form a redistribution layer, wherein the redistribution layer conformally covers the first region of the interconnecting line layer and the isolation structure, and a part of the redistribution layer above the first alignment mark forms a second alignment mark.

As shown in FIG. 1 to FIG. 14, in the process of forming the redistribution layer 40, any one of a chemical vapor deposition (CVD) process, a physical vapor deposition (PVD) process, an atomic layer deposition (ALD) process, or a sputtering process may be selected to deposit a conductive material. The conductive material conformally covers the first region 11 of the interconnecting line layer 10 and the isolation structure 30 to form the redistribution layer 40. A partial structure of the redistribution layer 40 located in the first region 11 conformally covers the first alignment mark 20, to form the second alignment mark 50 covering the outer sidewall of the first alignment mark 20.

In the method of manufacturing a semiconductor structure in this embodiment, the morphology of the first alignment mark is transferred to the second alignment mark, such that subsequently, the first alignment mark is measured and located more accurately on a surface of the redistribution layer according to the second alignment mark by using a probe, reducing the wiring complexity, and improving the precision of the measurement and positioning alignment of the semiconductor structure.

According to an exemplary embodiment, this embodiment is a further description of the first structure provided in step S110 in the foregoing embodiment. In the implementation process, as shown in FIG. 7, the first alignment mark 20 formed in the first region 11 includes a plurality of first sub-marks 21. A spacing between two adjacent first sub-marks 21 is a first spacing W1. The projection of the first sub-mark 21 on the interconnecting line layer 10 may be a triangle, a quadrangle, or a right-angled zigzag line.

As shown in FIG. 1 to FIG. 7, the second alignment mark 50 formed in this embodiment includes a plurality of second sub-marks 51. The quantity of the second sub-marks 51 is the same as that of the first sub-marks 21. Each of the second sub-marks 51 correspondingly covers an outer surface of a first sub-mark 21. The projection of the second sub-mark 51 on the interconnecting line layer 10 is similar to that of the first sub-mark 21 it covers, which is a triangle, a quadrangle, or a right-angled zigzag line. A spacing between adjacent second sub-marks 51 is a second spacing W2, and the second spacing W2 is 80% to 98% of the first spacing W1. For example, the second spacing W2 may be 80%, 82%, 84%, 85%, 87%, 89%, 90%, 92%, 94%, 95%, 97%, or 98% of the first spacing W1.

In some embodiments, the height of the first sub-mark 21 is the first height, the height of the second sub-mark 51 is the second height, and the ratio of the second height to the first height is 1.1 to 1.2:1.

In the semiconductor structure formed in this embodiment, the second sub-mark and the first sub-mark correspondingly covered by the second sub-mark have a same aspect ratio, and the morphology of the first sub-mark is transferred to the second sub-mark located above it.

In some embodiments, the first sub-mark 21 may further include a notch or a protrusion. The second sub-mark 51 has a notch or a protrusion similar to the notch or the protrusion of the first sub-mark 21. During the subsequent detection by using the probe, a comparison with another region is made according to the notch and the protrusion, to perform the positioning, such that the probe can detect more accurately, avoiding the detection failure.

As shown in FIG. 4, an exemplary embodiment of the present disclosure provides a method of manufacturing a semiconductor structure, including the following steps:

Step S210: Provide an interconnecting line layer.

As shown in FIG. 1 to FIG. 7, the interconnecting line layer 10 in this embodiment is a semiconductor structure in the back-end-of-line. The interconnecting line layer 10 is of the same structure in the foregoing embodiment. Details are not described herein again.

Step S220: Form an initial isolation layer, wherein the initial isolation layer covers the interconnecting line layer.

As shown in FIG. 1 to FIG. 8, the initial isolation layer 31 may be formed by using the following method: Any one of an ALD process, a CVD process, a PVD process, or a sputtering process is selected to deposit an isolation material and form the initial isolation layer 31. The initial isolation layer 31 covers a top surface of the interconnecting line layer 10. As shown in FIG. 1 to FIG. 9, the top surface of the initial isolation layer 31 is polished through the CMP process, such that the top surface of the initial isolation layer 31 forms a mask layer.

Step S230: Form an initial barrier layer, wherein the initial barrier layer covers the top surface of the initial isolation layer.

In the process of implementing this step, as shown in FIG. 1 to FIG. 10, a barrier material is deposited by using any one of the above deposition processes. The barrier material covers the top surface of the initial isolation layer 31 to form an initial barrier layer 61. The initial barrier layer 61 is configured to prevent the material of the redistribution layer 40 formed through the subsequent deposition from infiltrating into the initial isolation layer 31, where the infiltration causes the contamination of other devices.

Step S240: Completely remove the initial isolation layer in the first region of the interconnecting line layer and expose a top surface and a sidewall of the first alignment mark and a part of a top surface of the first region of the interconnecting line layer.

Figure 11:
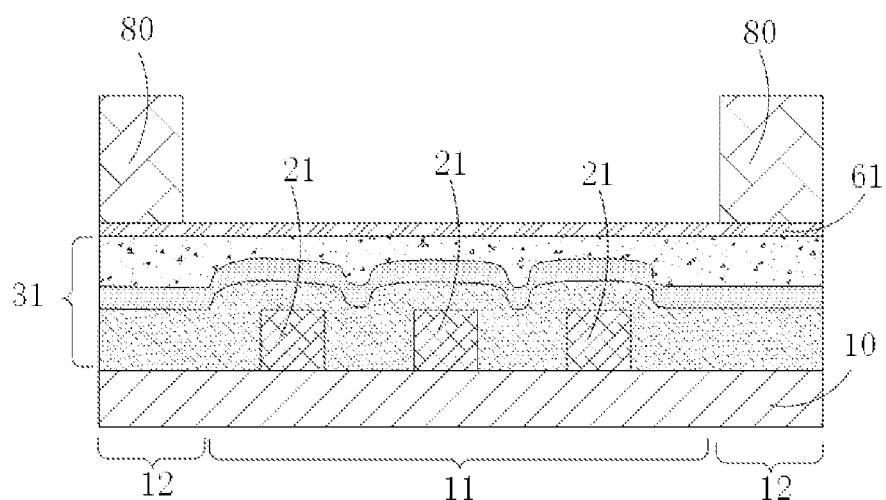
FIG. 11 is a schematic diagram of a cross section taken along A-A of forming a mask layer according to an exemplary embodiment.
Figure 12:
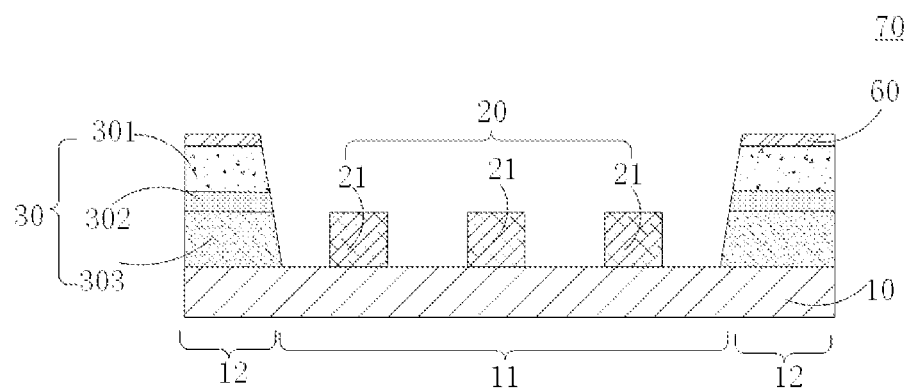
FIG. 12 is a schematic diagram of a cross section taken along A-A of a first structure according to an exemplary embodiment.

As shown in FIG. 1 to FIG. 11, a mask layer 80 is formed on the top surface of the initial barrier layer 61. The mask layer 80 is located above the second region 12 of the interconnecting line layer 10. The initial barrier layer 61 exposed by the mask layer 80 is removed through etching. The pattern of mask layer 80 is transferred to initial barrier layer 61. Then, the initial isolation layer 31 is etched according to the initial barrier layer 61. The top surface of the interconnecting line layer 10 is used as an etching stop layer to completely remove the initial isolation layer 31 in the first region 11 of the interconnecting line layer 10, and extend the pattern of mask layer 80 into initial isolation layer 31. As shown in FIG. 11 and FIG. 12, the initial isolation layer 31 retained in the second region 12 of the interconnecting line layer 10 forms the isolation structure 30. The initial barrier layer 61 retained in the second region 12 of the interconnecting line layer 10 forms the barrier layer 60 covering the top of the isolation structure 30 in the second region 12 of the interconnecting line layer 10. The barrier layer 60 is located between the isolation structure 30 and the redistribution layer 40 formed subsequently.

As shown in FIG. 1 to FIG. 12, the sidewall of the isolation structure 30 defines a groove in the first region 11 of the interconnecting line layer 10. The groove exposes the top surface and the sidewall of the first alignment mark 20 and the top surface of the first region 11 of the interconnecting line layer 10.

Step S250: Form a redistribution layer, wherein the redistribution layer conformally covers the first region of the interconnecting line layer and the isolation structure, and a part of the redistribution layer above the first alignment mark forms a second alignment mark.

As shown in FIG. 1 to FIG. 12, the step of forming the redistribution layer 40 in this embodiment is the same as the implementation of step S120 in the foregoing embodiment. Details are not described herein again In the manufacturing method of this embodiment, the redistribution layer in the first region of the interconnecting line layer directly covers the outer surface of the first alignment mark to form the second alignment mark. The morphology of the first alignment mark is directly transferred to the second alignment mark. The aspect ratio of the second alignment mark is proper. The morphology of the second alignment mark meets the optical requirements of the lithography machine and the registration measuring machine. When the probe is used to scratch the outer surface of the second alignment mark to perform registration measurement or positioning detection on the semiconductor structure subsequently, the probe can accurately and sensitively detect the second alignment mark, to determine the position of the first alignment mark according to the second alignment mark, thereby performing the registering or positioning alignment on the semiconductor structure.

According to an exemplary embodiment, compared with the foregoing embodiments, the following steps are added to this embodiment to process the redistribution layer 40.

Step S260: Process the redistribution layer through a thermal annealing process.

In this embodiment, the semiconductor structure is placed in a thermal annealing chamber, and the semiconductor structure may be annealed at a high temperature through, for example, rapid thermal annealing (RTA) or furnace annealing. For example, the semiconductor structure may be placed in a thermal annealing chamber at 900° C. to 1200° C. for an RTA process. Alternatively, the semiconductor structure may be annealed in a furnace tube at 600° C. to 800° C. for 10 min to 120 min.

After the thermal annealing treatment, with reference to FIG. 1, the material of the redistribution layer 40 is more compact and more regular, the gap between the inner materials of the redistribution layer 40 is reduced, and the outer surface of the redistribution layer 40 is smoother and more uniform, the surface stress on the outer surface of the redistribution layer 40 is eliminated, the deformation and crack tendency of the redistribution layer 40 are reduced, and the electrical performance of the redistribution layer 40 can be further improved.

In this embodiment, the redistribution layer is processed through the thermal annealing process, such that the outer surface of the redistribution layer is smooth and stress-free. When the probe scratches the outer surface of the redistribution layer, to detect the second alignment mark, the loss of the probe caused by the large particles on the outer surface of the redistribution layer is reduced, such that the probe can maintain a high sensitivity, increasing the probe life and reducing detection costs.

Figure 5:
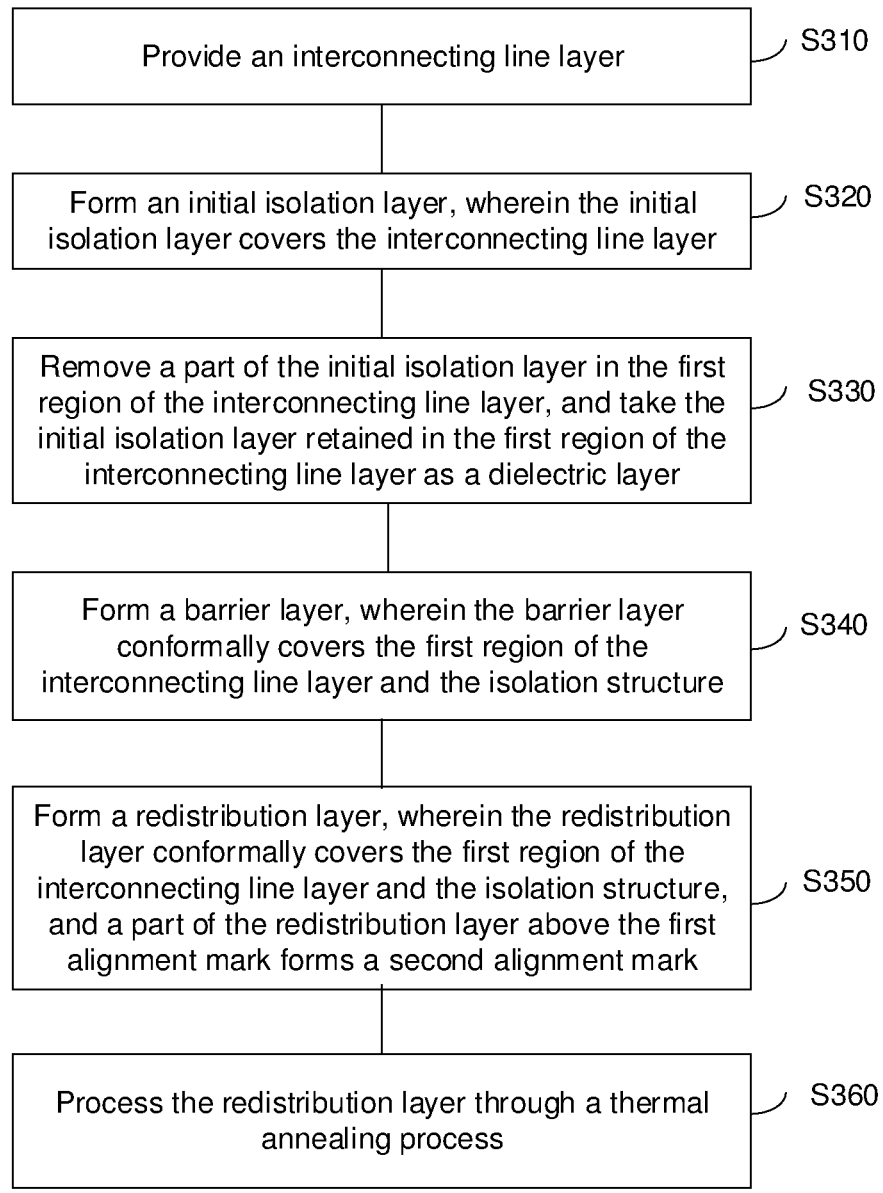
FIG. 5 is a flowchart of a method of manufacturing a semiconductor structure according to an exemplary embodiment.

As shown in FIG. 5, an exemplary embodiment of the present disclosure provides a method of manufacturing a semiconductor structure, including the following steps:

Step S310: Provide an interconnecting line layer.

As shown in FIG. 1 to FIG. 7, the interconnecting line layer 10 in this embodiment is a semiconductor structure in the back-end-of-line. The interconnecting line layer 10 is of the same structure in the foregoing embodiment. Details are not described herein again.

Step S320: Form an initial isolation layer, wherein the initial isolation layer covers the interconnecting line layer.

In this embodiment, the implementation of step S320 is the same as that of step S220 in the foregoing embodiment. Details are not described herein again.

Step S330: Remove a part of the initial isolation layer in the first region of the interconnecting line layer, and take the initial isolation layer retained in the first region of the interconnecting line layer as a dielectric layer.

Figure 13:
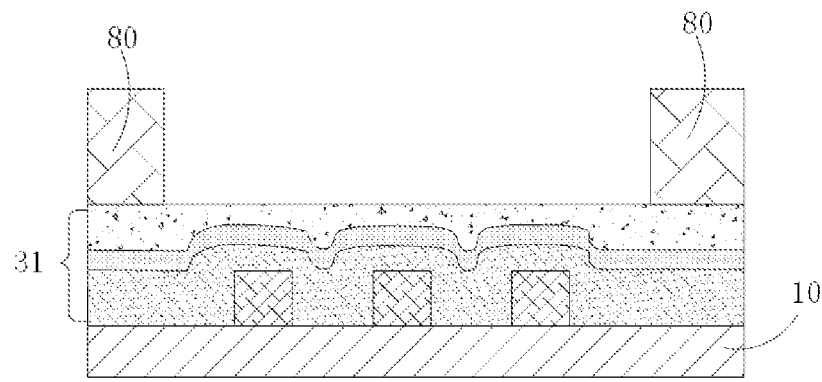
FIG. 13 is a schematic diagram of the cross section taken along A-A of forming the mask layer according to an exemplary embodiment.
Figure 14:
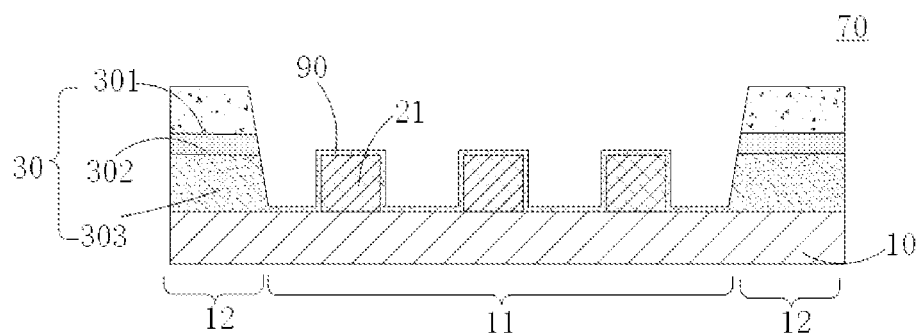
FIG. 14 is a schematic diagram of a cross section taken along A-A of the first structure according to an exemplary embodiment.
Figure 15:
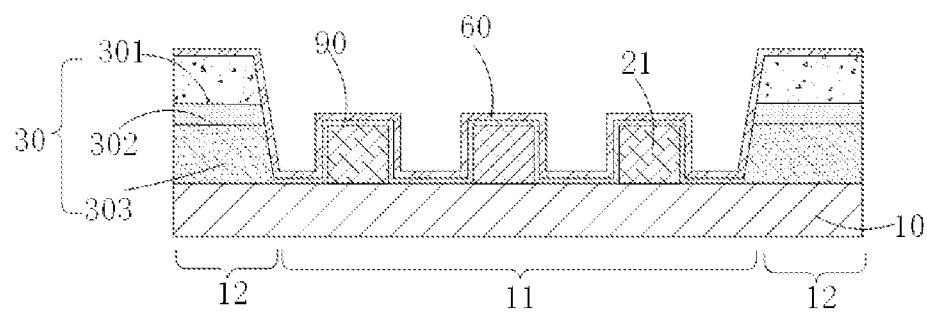
FIG. 15 is a schematic diagram of a cross section taken along A-A of forming a barrier layer according to an exemplary embodiment.

As shown in FIG. 1 to FIG. 13, a mask layer 80 is directly formed on the top surface of the initial isolation layer 31, and a part of the initial isolation layer 31 in the first region 11 of the interconnecting line layer 10 is removed through etching according to the mask layer 80. As shown in FIG. 13 and FIG. 14, a part of the initial isolation layer retained in the first region 11 of the interconnecting line layer 10 forms the dielectric layer 90. The initial isolation layer 31 retained in the second region 12 of the interconnecting line layer 10 forms the isolation structure 30.

As shown in FIG. 1 to FIG. 14, in this embodiment, a thickness of the dielectric layer 90 is smaller than a preset threshold. The preset threshold is one tenth of the height of the first alignment mark 20, that is, the thickness of the dielectric layer 90 is smaller than one tenth of the height of the first alignment mark 20, avoiding that the dielectric layer 90 is extremely thick to cause the deformation of the morphology transferred from the first alignment mark 20 through the dielectric layer 90, and ensuring that the morphology of the first alignment mark 20 can be well transferred to the second alignment mark 50, such that the detection result through the subsequent probe detection on the outer surface of the redistribution layer 40 is more accurate.

Step S340: Form a barrier layer, wherein the barrier layer conformally covers the first region of the interconnecting line layer and the isolation structure.

As shown in FIG. 1 to FIG. 15, a barrier layer 60 is formed by depositing a barrier material. A part of the barrier layer 60 covers the dielectric layer 90. Another part of the barrier layer 60 covers the top surface and the sidewall of the isolation structure 30. The barrier layer 60 covering the dielectric layer 90 is located in the first region 11 of the interconnecting line layer 10. The morphology of the first alignment mark 20 is transferred through the dielectric layer 90 into a part of the barrier layer 60 covering the dielectric layer 90.

In this embodiment, the thickness of the barrier layer 60 is smaller than the preset threshold. The preset threshold is one tenth of the height of the first alignment mark 20, that is, the thickness of the barrier layer 60 is smaller than one tenth of the height of the first alignment mark 20, to avoid that the barrier layer 60 is extremely thick to cause the deformation of the morphology transferred from the first alignment mark 20 through the dielectric layer 90 and the barrier layer 60.

Step S350: Form a redistribution layer, wherein the redistribution layer conformally covers the first region of the interconnecting line layer and the isolation structure, and a part of the redistribution layer above the first alignment mark forms a second alignment mark.

The step of forming the redistribution layer 40 in this embodiment is the same as the implementation of step S250 in the foregoing embodiment. Details are not described herein again.

As shown in FIG. 1 to FIG. 15, the redistribution layer formed in this embodiment conformally covers the barrier layer 60. The barrier layer 60 is located between the isolation structure 30 and the redistribution layer 40. A part of the redistribution layer 40 in the first region 11 of the interconnecting line layer 10 forms a second alignment mark 50. The second alignment mark 50 covers the outer surface of the first alignment mark 20. The morphology of the first alignment mark 20 is transferred to the second alignment mark 50 through the dielectric layer 90 and the barrier layer 60. The second alignment mark 50 has a morphology similar to that of the first alignment mark 20.

Step S360: Process the redistribution layer through a thermal annealing process.

The step of the thermal annealing process in this embodiment is the same as the implementation of step S260 in the foregoing embodiment. Details are not described herein again.

In the method of manufacturing this embodiment, after the part of the initial isolation layer located in the first region of the interconnecting line layer is removed, a barrier layer is formed through deposition, such that the barrier layer covers the top surface and the sidewall of the isolation structure and the dielectric layer. The barrier layer can prevent the material in the redistribution layer from diffusing into the isolation structure and the dielectric layer, where the diffusing causes the contamination of the functional region. The barrier layer protects the functional region better.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A semiconductor structure, comprising:
    an interconnecting line layer, wherein the interconnecting line layer comprises a first region and a second region, and the first region of the interconnecting line layer comprises a first alignment mark;
    an isolation structure, wherein the isolation structure is disposed in the second region of the interconnecting line layer; and
    a redistribution layer, wherein the redistribution layer conformally covers the first region of the interconnecting line layer and the isolation structure, the redistribution layer comprises a second alignment mark, and the second alignment mark is located above the first alignment mark;

the first alignment mark comprises a plurality of first sub-marks, and the second alignment mark comprises a plurality of second sub-marks; and a spacing between adjacent first sub-marks is a first spacing, a spacing between adjacent second sub-marks is a second spacing, and the second spacing is 80% to 98% of the first spacing.

2. The semiconductor structure according to claim 1, wherein
the first region is adjacent to the second region, and the redistribution layer covers a sidewall of the isolation structure.

3. The semiconductor structure according to claim 1, further comprising:
a dielectric layer, wherein the dielectric layer is disposed in the first region of the interconnecting line layer, and the dielectric layer is located between the interconnecting line layer and the redistribution layer, and a thickness of the dielectric layer is smaller than a preset threshold.

4. The semiconductor structure according to claim 1, further comprising:
a barrier layer, wherein the barrier layer at least covers a top of the isolation structure.

5. The semiconductor structure according to claim 4, wherein the barrier layer conformally covers the first region of the interconnecting line layer and the isolation structure, and the barrier layer is located below the redistribution layer.

6. The semiconductor structure according to claim 1, further comprising a functional region, wherein the first region of the interconnecting line layer is electrically isolated from the functional region.

7. A method of manufacturing a semiconductor structure, comprising:
providing a first structure, wherein the first structure comprises an interconnecting line layer and an isolation structure, the interconnecting line layer comprises a first region and a second region, a first alignment mark is formed in the first region of the interconnecting line layer, and the isolation structure is formed in the second region of the interconnecting line layer; and forming a redistribution layer, wherein the redistribution layer conformally covers the first region of the interconnecting line layer and the isolation structure, and a part of the redistribution layer above the first alignment mark forms a second alignment mark;

wherein the first alignment mark comprises a plurality of first sub-marks, and the second alignment mark comprises a plurality of second sub-marks; and a spacing between adjacent first sub-marks is a first spacing, a spacing between adjacent second sub-marks is a second spacing, and the second spacing is 80% to 98% of the first spacing.

8. The method of manufacturing the semiconductor structure according to claim 7, wherein the providing a first structure comprises:
providing the interconnecting line layer;
forming an initial isolation layer, wherein the initial isolation layer covers the interconnecting line layer;
completely removing the initial isolation layer in the first region of the interconnecting line layer and exposing a top surface and a sidewall of the first alignment mark and a part of a top surface of the first region of the interconnecting line layer; or removing a part of the initial isolation layer in the first region of the interconnecting line layer, and taking the initial isolation layer retained in the first region of the interconnecting line layer as a dielectric layer; and
taking the initial isolation layer retained in the second region of the interconnecting line layer as the isolation structure.

9. The method of manufacturing the semiconductor structure according to claim 8, wherein a thickness of the dielectric layer is smaller than a preset threshold.

10. The method of manufacturing the semiconductor structure according to claim 8, wherein the forming an initial isolation layer comprises:
depositing an isolation material and forming the initial isolation layer, wherein the initial isolation layer covers a top surface of the interconnecting line layer, and a top surface of the initial isolation layer is a plane.

11. The method of manufacturing the semiconductor structure according to claim 8, further comprising:
forming a barrier layer, wherein the barrier layer at least covers a top of the isolation structure, and the barrier layer is located between the isolation structure and the interconnecting line layer.

12. The method of manufacturing the semiconductor structure according to claim 11, wherein the barrier layer conformally covers the first region of the interconnecting line layer and the isolation structure, and the barrier layer is located below the redistribution layer.

13. The method of manufacturing the semiconductor structure according to claim 7, after the forming a redistribution layer, further comprising:
processing the redistribution layer through a thermal annealing process.

* * * * *